US006618932B2

(12) United States Patent
Hasegawa

(10) Patent No.: US 6,618,932 B2
(45) Date of Patent: Sep. 16, 2003

(54) TERMINAL CHANGEOVER SYSTEM

(75) Inventor: Hiroshi Hasegawa, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/811,620

(22) Filed: Mar. 20, 2001

(65) Prior Publication Data

US 2001/0023531 A1 Sep. 27, 2001

(30) Foreign Application Priority Data

Mar. 22, 2000 (JP) .................................... P 2000-080220

(51) Int. Cl.[7] .......................... H05K 13/00; B23P 19/00

(52) U.S. Cl. ............................ 29/747; 29/712; 29/761; 29/753; 29/33 M; 29/863; 72/441; 72/712; 72/446

(58) Field of Search .......................... 29/747, 712, 718, 29/761, 749, 759, 760, 874, 863, 753, 33 M; 72/441, 445, 442, 712

(56) References Cited

U.S. PATENT DOCUMENTS 4,653,182 A * 3/1987 Fukuda et al. ................ 29/754
5,095,599 A * 3/1992 Gloe et al. ................. 29/33 M
5,115,560 A * 5/1992 Erb et al. ..................... 29/747
5,131,124 A * 7/1992 Skotek ...................... 29/33 M
5,197,186 A * 3/1993 Strong et al. ................. 29/863
5,432,995 A * 7/1995 Takenami et al. ............. 29/753
5,661,897 A * 9/1997 Kaneda et al. ................ 29/753
5,799,391 A * 9/1998 Tillotson ..................... 29/753
5,852,868 A * 12/1998 Soriano ....................... 29/753
6,276,052 B1 * 8/2001 Avenoso et al. .............. 29/751
6,327,775 B1 * 12/2001 Oishi et al. ................... 29/751
2001/0023531 A1 * 9/2001 Hasegawa .................... 29/747

FOREIGN PATENT DOCUMENTS

JP 10-247577 9/1998
JP 11-251031 9/1999
WO WO 98/09356 * 3/1998

* cited by examiner

*Primary Examiner*—Peter Vo
*Assistant Examiner*—Minh Trinh
(74) *Attorney, Agent, or Firm*—Finnegan, Henderson, Farabow, Garrett & Dunner, L.L.P.

(57) ABSTRACT

On a turntable are disposed a plurality of applicators and their respective terminal reels holding strings of terminals. A rail and a shank holder guide are provided between a press for operating one of the applicators and a waiting position on the turntable. One of the applicators alone moves between a set position in the press and the waiting position on the turntable.

9 Claims, 4 Drawing Sheets

TERMINAL CHANGEOVER SYSTEM

BACKGROUND OF THE INVENTION

1. Field of the Invention

The present invention relates to a terminal changeover system for changing an applicator to be placed in a press according to a required kind of terminals.

2. Description of the Related Art

To a press for crimping a terminal onto a wire, an applicator is detachably mounted. The applicator is changeable in accordance with the kind of terminals to be crimped. When an operator carries an applicator with his hand, he is subjected to such a possible accident as his finger is caught between an anvil and a crimping fixture of the applicator or he inadvertently drops the applicator on his foot. In this context, several kinds of terminal changeover systems have been provided which enable an operator to change an applicator to another one without carrying them with his hand.

In such a conventional terminal changeover system, an applicator supply unit is integrally composed of applicators, an applicator supply table and terminal reels as terminal holders. The applicator has an anvil for holding a terminal and a crimping fixture provided to be attachable/detachable to/from the anvil for applying deformation stress to the terminal held on the anvil to crimp the terminal onto a wire. On the top of the fixture, a shank is provided to protrude upwardly.

The applicator supply table consists of a table for fixing the applicators thereon and a stand set up on the table. The terminal reel is rotatably supported on the upper part of the stand of the applicator supply table. On the terminal reel, a string of terminals in which a number of terminals are connected in chain are wound to be held.

The press is configured to have the applicator placed in a set position demountably mounted thereon, and operate the mounted applicator. The press has a rail and a shank holder guide that is spaced from the rail. Through the shank holder guide, the applicator supply unit is guided to move between the set position and a waiting position. More specifically, the applicator supply table is disposed on the rail, the shank of the applicator is engaged with the shank holder guide, and the applicator supply table slides on the rail with the shank guided by the shank holder guide, whereby the applicator supply unit moves on a prescribed route.

In order to change terminals to be crimped to another kind of terminals in the above structure, the applicator placed in the press is unlocked, and the applicator supply unit is moved from the set position to the waiting position through the guide of the shank holder guide. Then another applicator supply unit holding a desired applicator is set in the waiting position. The applicator supply unit is moved from the waiting position to the set position through the guide of the shank holder guide, and the applicator is locked to complete the change.

The above conventional terminal changeover system, however, requires moving the applicator supply unit (to be more specific, a heavy load consisting of the applicator, the applicator supply table and the terminal reel) in order to change terminals to be crimped, which presents low workability in changing applications. Further, it requires a design which avoids interference between the terminal reel and the applicator supply table, and the press at the time of movement of the applicator supply unit. This reduces degree of freedom in design of each component. Such a requirement as the terminal reel should be higher than the press hinders a compact design, resulting in a large device as a whole.

SUMMARY OF THE INVENTION

The present invention has been achieved with such points in view.

It is therefore an object of the present invention to provide a terminal changeover system in which moving an applicator is easy to improve workability in applicator change (that is, workability in terminal change), and there is no need to pay attention to interference between a terminal holder and an applicator supply table, and a press, which fact solves problems resulting from such an attention to interference.

According to a first aspect of the invention, there is provided a terminal changeover system including an applicator for crimping a terminal, a supplier for supplying the terminal to the applicator in a first position, a press for operating the applicator in a second position, and a first guide for guiding the applicator between the first and second positions.

According to a second aspect of the invention, the supplier includes a holder for holding the terminal.

Thus in this invention, since the applicator alone is moved between the first and second positions through the guide, which structure eliminates the need for moving a terminal holder and an applicator supply table together. This provides easy moving of the applicator, improving workability in changing the applicator, and makes the machine compact as a whole. In addition, the above structure eliminates the need for design consideration to avoid interference between the terminal holder and the applicator supply table, and the press, solving problems resulting from such consideration.

According to a third aspect of the invention, the supplier includes a turntable for a plurality of applicators to be arranged on, the turntable to be rotated to place one of the applicators in the first position.

Thus in this invention, a mounting space on the turntable provides a sufficient space to accommodate and move a plurality of applicators, contributing to the compactness of the machine.

According to a fourth aspect of the invention, the supplier includes a respective holder being mated with a respective applicator and holding a respective terminal.

Thus in this invention, the rotation of the turntable rotates the applicators together with the paired holders, resulting in easy routing of the string of terminals from the holder.

According to a fifth aspect of the invention, the terminal changeover system further includes a second guide for guiding the terminal between the holder and the first position.

According to a sixth aspect of the invention, the second guide is flexible.

Thus in this invention, the string of terminals from the holder to the applicator is guided by the second guide on a prescribed route, which reduces accidents due to the tangling of the string of terminal to the minimum.

According to a seventh aspect of the invention, the terminal changeover system further includes a sensor for detection of entanglement a string of terminals between the holder and the first position.

Thus in this invention, the sensor detects a possible entanglement of the string of terminals, which enables proactive prevention against a possible accident due to the tangling of the string of terminals.

According to a eighth aspect of the invention, the first guide includes a first rail for one end of the applicator to be disposed on and a second rail for another end of the applicator to be engaged with.

Thus in this invention, the applicator is moved securely along a prescribed route with the second end engaged with the fourth guide and with the crimping fixture fixed not to move. Thus an operator is safely protected from such an accident as his finger is caught between the crimping fixture and the anvil of the applicator.

According to a ninth aspect of the invention, the supplier includes a third rail for one end of the applicator to be disposed on, the third rail being in connection with the first rail, and a fourth rail for another end of the applicator to be engaged with, the fourth rail being in connection with the second rail.

Thus in this invention, the applicator is moved securely between the first and second positions.

BRIEF DESCRIPTION OF THE ACCOMPANYING DRAWINGS

The above and further objects and novel features of the invention will more fully appear from the following detailed description when the same is read in conjunction with the accompanying drawings, in which.

DETAILED DESCRIPTION OF THE PREFERRED EMBODIMENT

With reference to the accompanying drawings, a preferred embodiment of this invention will now be described.

Figure 1:
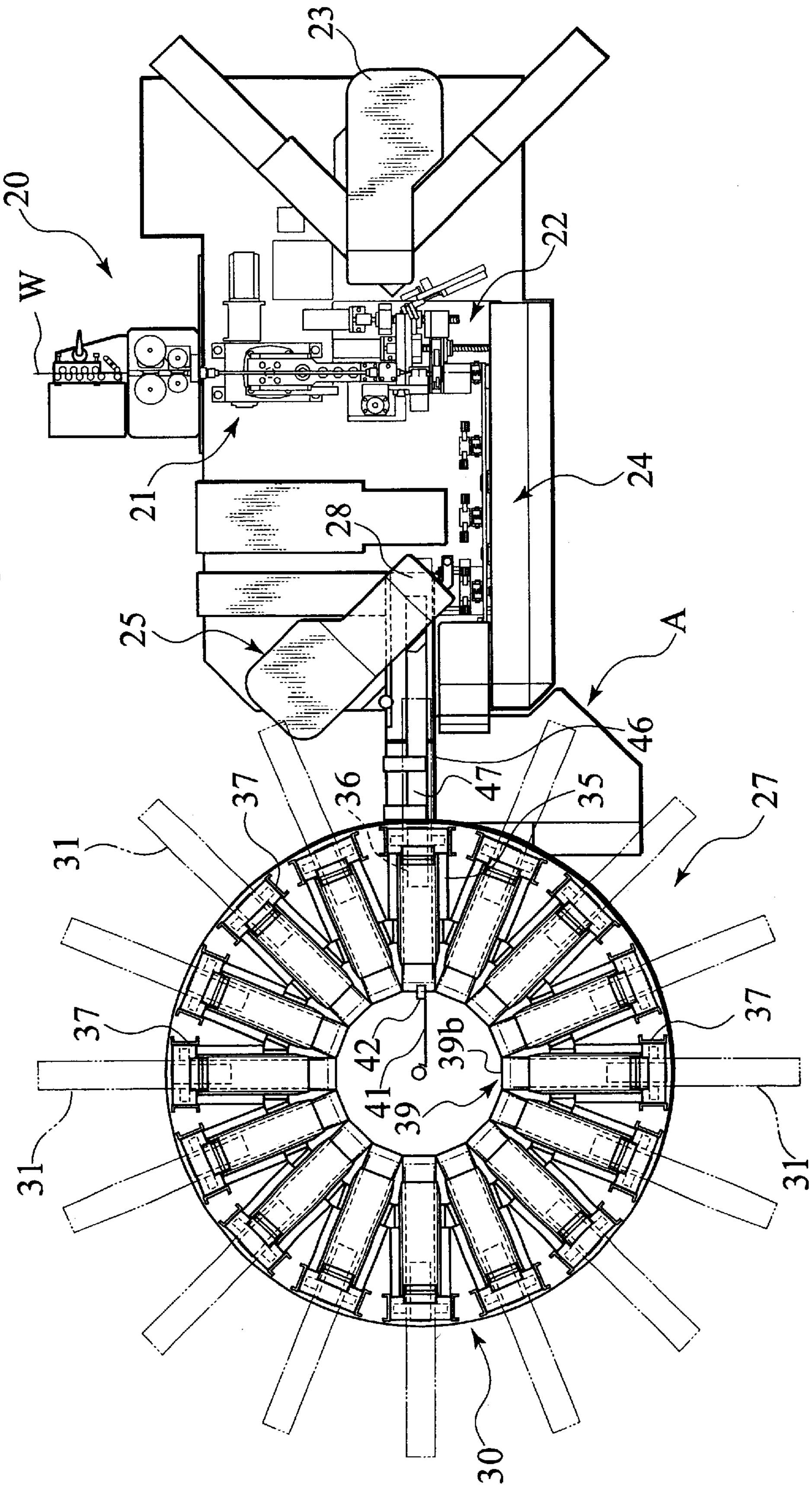
FIG. 1 is a plan view of a wire termination machine to which is applied a terminal changeover system according to an embodiment of this invention.
Figure 2:
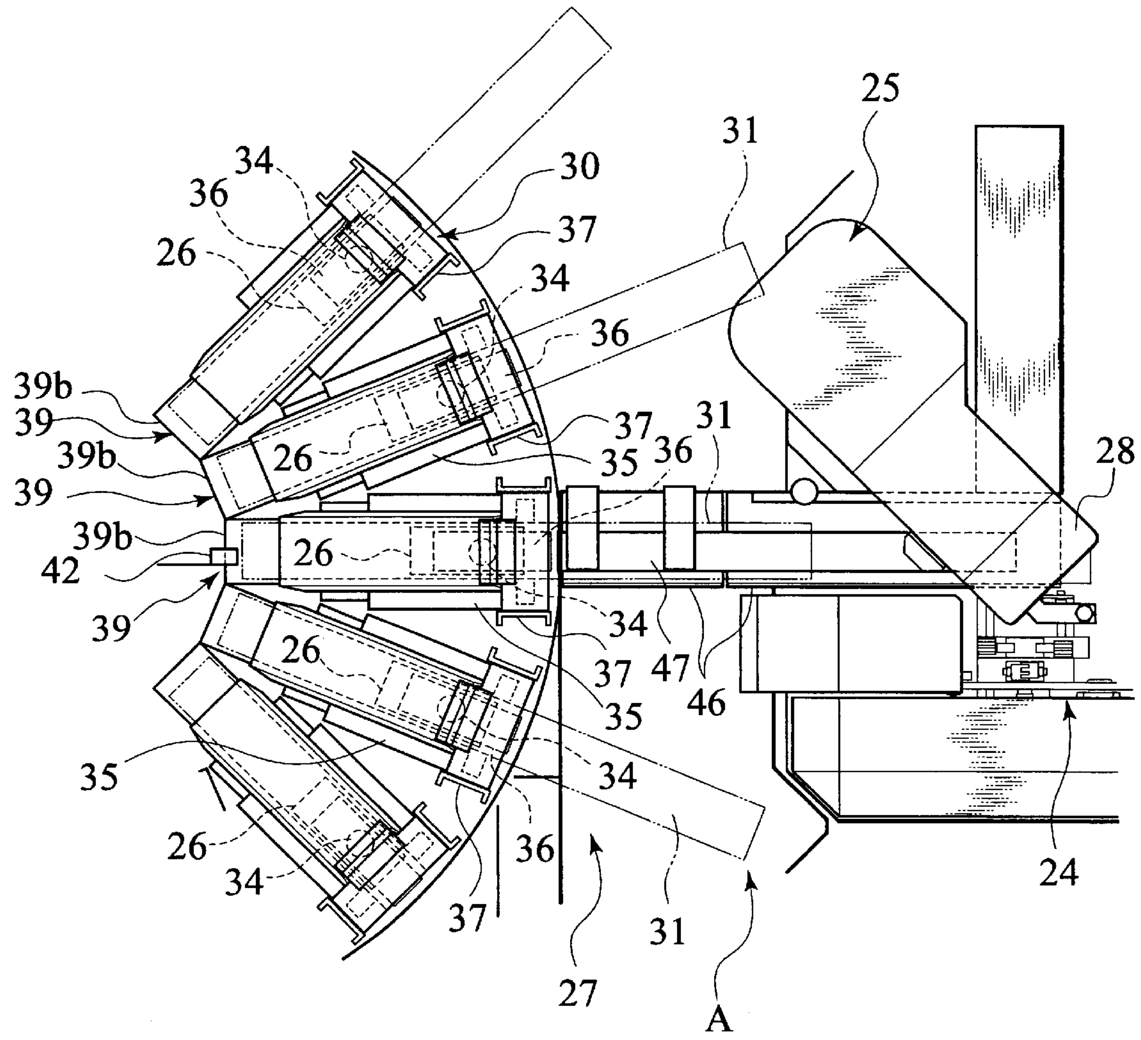
FIG. 2 is an enlarged plan view of the terminal changeover system in FIG. 1.

As shown in FIG. 1, a wire terminal manufacturing machine 20 includes a wire feeder 21 for successively feeding a long length of wire W by a prescribed length, a wire stripping and cutting unit 22 for cutting the wire W to a prescribed length, a first terminal crimping unit 23 for crimping a terminal onto one end of the wire W stripped by the unit 22, a wire transporter 24 for transporting the wire W of the prescribed length cut by the unit 22, and a second terminal crimping unit 25 for crimping a terminal to the other end of the wire W of the prescribed length transported by the transporter 24. A terminal changeover system A of this invention is applied to the second terminal crimping unit 25.

As shown in FIGS. 1 to 4, the terminal changeover system A includes a supplier 27 in which a plurality of applicators 26 are held, a press 28 for operating the applicator 26 to crimp a terminal onto an end of the wire W, and a guide 29 as a first guide for guiding the applicator 26 between the supplier 27 and the press 28.

The supplier 27 has a turntable 30 rotatably mounted thereto, on which several kinds of applicators 26 and terminal reels 31 as terminal holders are disposed radially in pairs. A prescribed rotational position of the turntable 30 is set as a first position as a waiting position for the applicator 26 to be supplied to the press 28. Each pair of applicator 26 and terminal reel 31 is selectively placed in the first position by the rotation of the turntable 30. Each applicator 26 has an anvil 32 for holding a terminal not shown in the figures and a crimping fixture 33 arranged to attachable/detachable to/from the anvil 32, for applying deformation stress to crimp the terminal held by the anvil 32 onto the wire W. On the top of the crimping fixture 33, a shank 34 is provided to be protruded upwardly. Each applicator 26 on the turntable 30 is disposed on a rail 35 as a third rail at its bottom. The shank 34 is engaged with a shank holder guide 36 as a fourth rail and is configured to be movable separately.

Each of the terminal reels 31 is provided rotatably at the upper part of a stand 37 detachably set up on the turntable 30. The terminal reel 31 holds a string of terminals 38 wound thereon, in which a number of terminals (not shown in the figures) are connected in a chain. To the stand 37, is fixed a terminal guide 39 as a second guide consisting of a horizontal guide member 39*a* and a vertical guide member 39*b* in an enclosure shape. Through the guide 39, the string of terminal 38 is fed from the terminal reel 31 to the applicator 26 in a prescribed route. The vertical guide member 39*b* is made of a flexible material which is easily deformed when the tension of the string of terminals 38 is increased. At the lower end of the vertical guide member 39*b*, a detection piece 40 is provided. When excessive tension is applied to the string of terminals 38, the vertical guide member 39*b* is bent as shown in an imaginary line in FIG. 4.

On the turntable 30, is provided a sensor supporter 41 which does not rotate with the turntable 30. To the sensor supporter 41, a sensor 42, such as a photo-electric switch, an infrared sensor, or photo sensor, is mounted. The sensor 42 detects entanglement of the string of terminals 38 with the detection piece 40. When the sensor 42 detects the tangling of the string of terminals 38, such a measure as suspending the operation of the press 28 or alarming the entanglement is taken.

The press 28 is equipped with a locking means not shown in the figures with which the applicator 26 (in a solid line in FIGS. 3 and 4) placed in a second position as a set position is detachably mounted thereto. As shown in FIG. 4, the press 28 also has a ram 28*a* that is movable up and down by a drive source 51 such as an air cylinder. The ram 28*a* is provided with an engagement part 28*b* to be engaged with the shank 34. The shank 34 of the applicator 26 in the second position engages the part 28*b* so that the up and down movement of the ram 28*a* moves the crimping fixture 33 for attachment/detachment to/from the anvil 32 of the applicator 26.

The guide 29 has a rail 46 as a first rail fixed to a frame 45 supporting the press 28 and the shank holder guide 47 as a second rail. The rail 46 and the shank holder guide 47 are disposed in parallel in the longitudinal direction at a prescribed distance. One end of the guide 29 is placed in the second position of the applicator 26 and the other end is extended to the first position on the turntable 30, to be linked to the rail 35 and the shank holder guide 36 of the applicator in the first position. More specifically, when the applicator is in the first position on the turntable 30, the applicator 26 is disposed on the rail 35, and the shank 34 of the applicator 26 is engaged with the shank holder guide 36. When the applicator 26 is moved to the second position, the applicator 26 alone slides on the rails 35 and 46 with the shank 34 guided by the shank holder guides 36 and 47 to the second position on a prescribed route. The same holds when the applicator 26 is moved from the second position to the first position, conversely.

Figure 3:
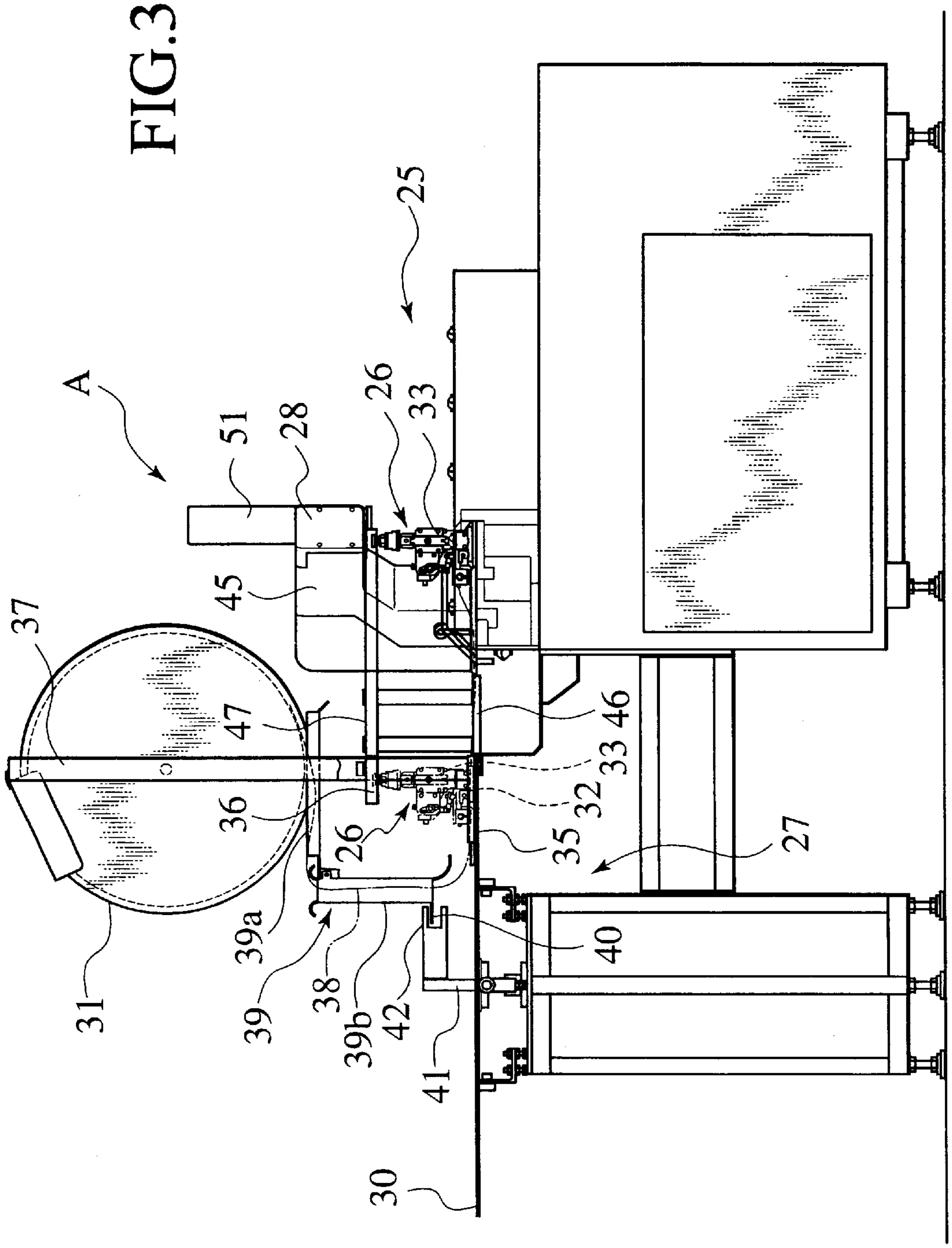
FIG. 3 is a side view of the terminal changeover system in FIG. 1.
Figure 4:
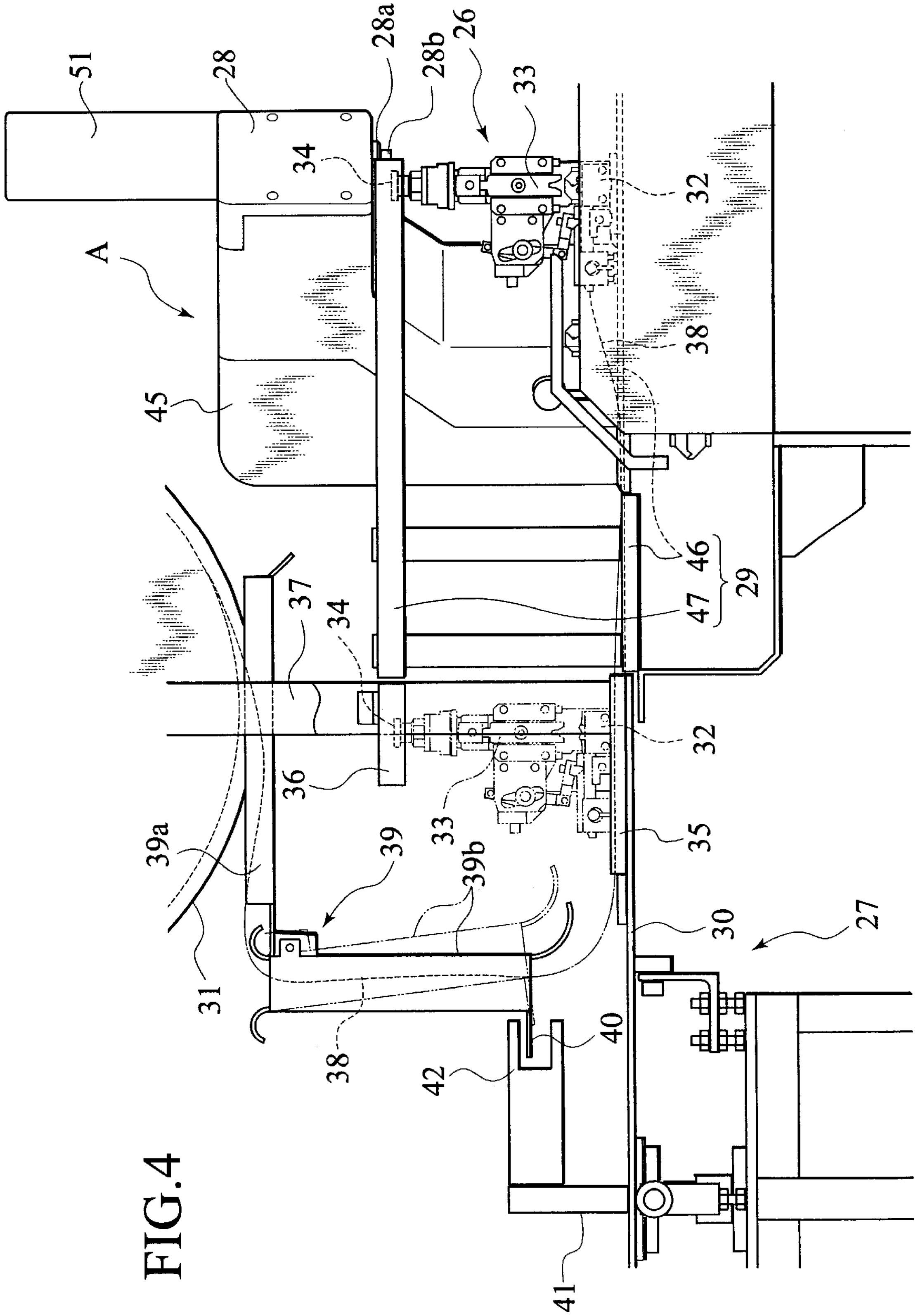
FIG. 4 is an enlarged side view of the main part of the terminal changeover system in FIG. 1.

In order to change a kind of terminals to be crimped in the above structure, the applicator 26 placed in the press 28 is unlocked to be moved on the rail 46 through the shank holder guide 47 from the second position shown in the solid line to the first position shown in the imaginary line in FIGS. 3 and 4. Then the turntable 30 is rotated to set a desired applicator 26 in the first position. The new applicator 26 is moved on the rail 46 from the first position to the second position through the guide of the rail 46, and the applicator 26 is locked to complete the change.

The changeover of the terminals, that is, the changing operation of the applicator 26 as described above eliminates need for moving the terminal holder (terminal reel) and the applicator supply table together with the applicator 26 to be moved as in the conventional structure. Thus the applicator 26 is easily moved and the workability in changeover of the applicator 26 is improved. In short, the compact terminal changeover system A enables a significantly easy changeover of terminals. Further, there is no need to pay attention to the interference between the terminal holder and the applicator supply table, and the press 28. Thus degree of freedom in designing each component is increased. Further, such a fact as the terminal reel 31 needs not be higher than the press 28 enables a compact design to make the device as a whole compact. Furthermore, since it is possible to decrease the height of the terminal reel 31, workability in changing the string of terminals 38 is improved. These facts solve problems resulting from consideration to the interference between the terminal holder and the applicator supply table, and the press 28.

Since a plurality of applicators 26 are disposed on the turntable 30, and one of the applicators 26 is selectively placed in the first position by the rotation of the turntable 30, a mounting space on the turntable 30 is nearly sufficient as a space to accommodate and move the applicators 26, resulting in compactness of the system as a whole.

Since a plurality of terminal reels 31 is fixed on the turntable for their respective applicators 26, the rotation of the turntable 30 rotates the applicators 26 and the corresponding terminal reels 31. This makes it easy to route the strings of terminals 38 from the terminal reels 31. The conventional structure moves the terminal reels together with the applicators, in which there is no need to pay attention to the routing of the strings of terminals 38. In the present embodiment, the terminal reel 31 is fixed to be away from the applicator 26 moving to the second position, which requires consideration on this matter. This arrangement makes it easy to route the string of terminals 38.

Since the turntable 30 is provided with the terminal guide 39 as the second guide for guiding the string of terminals 38 fed from the terminal reel 31 to the applicator 26 to pass a prescribed route, the terminal guide 39 guides the string of terminals 38 from the terminal reel 31 to the applicator 26 in a prescribed route. This minimizes an accident caused by entanglement of the string of terminals 38. More specifically, the terminal reel 31 is fixed and is away from the applicator 26 as described above, which increases the rate of accident due to the entanglement of the string of terminal 38. The above arrangement best avoids such an accident.

Since the terminal guide 39 is provided with the sensor 42 to check the string of terminal 38 for entanglement, the sensor 42 detects a possible entanglement of the string of terminals 38. This proactively prevents a possible accident caused by tangling of the string of terminals 38. That is, the terminal reel 31 is fixed and is away from the applicator as described above, which increases the rate of accident caused by the entanglement of the string of terminals 38. This arrangement best avoids such an accident.

Since the guide 29 has the rail 46 on which the applicator is disposed at its bottom and the shank holder guide 47 with which the shank 34 is engaged, the applicator 26 is moved with the shank 34 engaged with the guide 47 to positively move on the prescribed route with the crimping fixture 33 fixed not to move up and down. Accordingly, an operator is safely protected from such an accident as his finger is caught between the fixture 33 and the anvil 32.

Although the above embodiment exhibits the case where the terminal changeover system A of this invention is used in the second terminal crimping unit 25, the system A can also be used in the first crimping unit 23. Further, although the terminal reel 31 constitutes the terminal holder, the holder can be anything that holds the string of terminals 38 and feeds the string 38 to the applicator 26.

The entire contents of Japanese Patent Application 2000-080220 (filed on Mar. 22, 2000) are incorporated herein by reference.

Although the invention has been described above by reference to a certain embodiment of the invention, the invention is not limited to the embodiment described above. Modifications and variations of the embodiments described above will occur to those skilled in the art, in light of the above teachings. The scope of the invention is defined with reference to the following claims.

What is claimed is:

1. A terminal changeover system comprising:

an applicator for crimping a terminal, the applicator further comprising an anvil and a crimping fixture;

a supplier for supplying the terminal to the applicator in a first position;

a press for operating the applicator in a second position, the second position allowing the press to operate the applicator; and a first guide for guiding the applicator between the first and second positions, the first guide further comprising at least one rail having first and second ends, the second end placed in the second position, and the first end extended to the first position, the first position being a distance from the press and the second position.

2. The terminal changeover system as set forth in claim 1, wherein the supplier includes a holder for holding the terminal.

3. The terminal changeover system as set forth in claim 2, further comprising a sensor for detection of entanglement of a string of terminals between the holder and the first position.

4. The terminal changeover system as set forth in claim 2, further comprising a second guide for guiding the terminal between the holder and the first position.

5. The terminal changeover system as set forth in claim 4, wherein the second guide is flexible.

6. The terminal changeover system as set forth in claim 1, wherein the supplier includes a turntable for a plurality of applicators to be arranged on, the turntable to be rotated to place one of the applicators in the first position.

7. The terminal changeover system as set forth in claim 6, wherein the supplier includes a respective holder being mated with a respective applicator and holding a respective terminal.

8. The terminal changeover system as set forth in claim 1, wherein the first guide comprises a first rail for one end of the applicator to be disposed on and a second rail for another end of the applicator to be engaged with.

9. The terminal changeover system as set forth in claim 8, wherein the supplier comprises a third rail for one end of the applicator to be disposed on, the third rail being in connection with the first rail, and a fourth rail for another end of the applicator to be engaged with, the fourth rail being in connection with the second rail.

* * * * *